(12) United States Patent
Kerr et al.

(10) Patent No.: US 8,034,663 B2
(45) Date of Patent: Oct. 11, 2011

(54) LOW COST DIE RELEASE WAFER

(75) Inventors: Roger S. Kerr, Brockport, NY (US); Timothy J. Tredwell, Fairport, NY (US); Seung-Ho Baek, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 522 days.

(21) Appl. No.: 12/237,127

(22) Filed: Sep. 24, 2008

(65) Prior Publication Data

US 2010/0071206 A1 Mar. 25, 2010

(51) Int. Cl.
*H01L 21/78* (2006.01)
(52) U.S. Cl. .................................. 438/110; 438/464
(58) Field of Classification Search .................. None
See application file for complete search history.

(56) References Cited

U.S. PATENT DOCUMENTS

| | | | |
|---|---|---|---|
| 3,655,496 A | 4/1972 | Ettre et al. | |
| 4,571,826 A | 2/1986 | Jacobs | |
| 5,833,073 A | 11/1998 | Schatz et al. | |
| 6,029,427 A | 2/2000 | Freund et al. | |
| 7,195,733 B2 | 3/2007 | Rogers et al. | |
| 2004/0020036 A1 | 2/2004 | Arneson et al. | |
| 2004/0020040 A1 * | 2/2004 | Arneson et al. | 29/825 |
| 2005/0005434 A1 | 1/2005 | Arneson et al. | |
| 2005/0199584 A1 | 9/2005 | Nuzzo et al. | |
| 2006/0084012 A1 | 4/2006 | Nuzzo et al. | |
| 2007/0032089 A1 | 2/2007 | Nuzzo et al. | |
| 2007/0035466 A1 * | 2/2007 | Coleman et al. | 343/895 |
| 2007/0107827 A1 | 5/2007 | Takahashi et al. | |
| 2007/0281391 A1 | 12/2007 | Ito et al. | |
| 2008/0119030 A1 | 5/2008 | Kunii | |

FOREIGN PATENT DOCUMENTS

| | | |
|---|---|---|
| EP | 1 229 581 A2 | 8/2002 |
| EP | 1 408 365 A2 | 4/2004 |
| WO | WO 2004/012896 A1 | 2/2004 |
| WO | 2005122285 | 12/2005 |

OTHER PUBLICATIONS

Ouellette, Jennifer, "Exploiting Molecular Self-Assembly," 28 The Industrial Physicist, American Institute of Physics, Dec. 2000, 3 Pages.

Usami, Mitsuo et al., "Powder LSI: An Ultra Small RF Identification Chip for Individual Recognition Applications," 2003 IEEE International Solid-State Circuits Conference, IEEE/ISSCC 2003 Visuals Supplement, pp. 326, 327 and 579.

* cited by examiner

*Primary Examiner* — Zandra Smith
*Assistant Examiner* — Pamela E Perkins
(74) *Attorney, Agent, or Firm* — Nelson Adrian Blish

(57) ABSTRACT

Exemplary embodiments provide methods and systems for assembling electronic devices, such as integrated circuit (IC) chips, using a release member having a phase change material. Specifically, IC elements/components can be selectively received, stored, inspected, repaired, and/or released in a scalable manner during the assembly of IC chips by inducing phase change of the phase change material. The release member can be glass with the IC elements grown on the glass. In some embodiments, the release member can be used for a low cost placement of the IC elements in combination with an intermediate transfer layer.

14 Claims, 7 Drawing Sheets

LOW COST DIE RELEASE WAFER

DESCRIPTION OF THE INVENTION

1. Field of the Invention

This invention relates generally to assembly of semiconductor devices and, more particularly, to the assembly of integrated circuit elements.

2. Background of the Invention

As market demand increases for integrated circuit (IC) products such as RFID tags, and as IC die sizes shrink, high assembly throughput rates for very small die and low production costs are crucial in providing commercially viable products. For example, the cost of an RFID device still depends on assembly complexity.

Conventional methods for assembling IC products include pick and place techniques. Such techniques involve a manipulator, such as a robot arm, to remove IC dies from a wafer and place them into a die carrier. The dies are subsequently mounted onto a substrate with other electronic components, such as antennas, capacitors, resistors, and inductors to form an electronic device. However, these techniques have drawbacks and disadvantages. For example, the pick and place techniques involve complex robotic components and control systems that handle only one die at a time. In addition, pick and place techniques have limited placement accuracy, and have a minimum die size requirement.

Thus, there is a need to overcome these and other problems of the prior art and to provide controllable methods for a scalable and low cost assembly in receiving, storing, and releasing electronic device elements.

SUMMARY OF THE INVENTION

In accordance with the present teachings, a method for assembling integrated circuits is provided.

The exemplary method can include forming a silicon layer on a phase change material of a release member; forming a plurality of bump bonds on the silicon layer of the release member; forming one or more spaced dies on the phase change material by etching through the silicon layer, wherein each spaced die comprises one or more bump bonds formed on an etched silicon layer; and exposing the phase change material to an energy to induce a phase change for selectively releasing the one or more spaced dies from the release member.

In accordance with the present teachings, a method for assembling integrated circuits is provided.

The exemplary method can include forming an integrated circuit (IC) layer on a phase change material of a release member; forming a plurality of bump bonds on the IC layer of the release member; forming one or more spaced dies on the phase change material by etching through the IC layer, wherein each spaced die comprises one or more bump bonds formed on an etched IC layer; coupling an intermediate transfer member onto a first surface of the one or more spaced dies; and exposing the phase change material to an energy to induce a phase change for selectively releasing the one or more spaced dies from the release member removing the release member and exposing a second surface of the one or more spaced dies, wherein the second surface is substantially parallel to the first surface; coupling a second phase change surface of a second release member onto the exposed second surface of the one or more spaced dies; removing the intermediate transfer member from the first surface of the one or more spaced dies; and exposing the coupled phase change material to an energy for selectively releasing the one or more dies from the release member.

In accordance with the present teachings, a method for controlling an assembly of IC elements is provided.

The exemplary method can include coupling one or more IC elements onto a phase change material of a release member; selectively inspecting a group of the one or more IC elements on the phase change material; and selectively applying an energy to a portion of the phase change material to release an inspected IC element for repair.

In accordance with the present teachings, an assembly of IC elements is provided.

The exemplary assembly can include a release member comprising a glass support and a phase change material formed on the glass support; and one or more spaced IC elements coupled to the phase change material of the release member.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
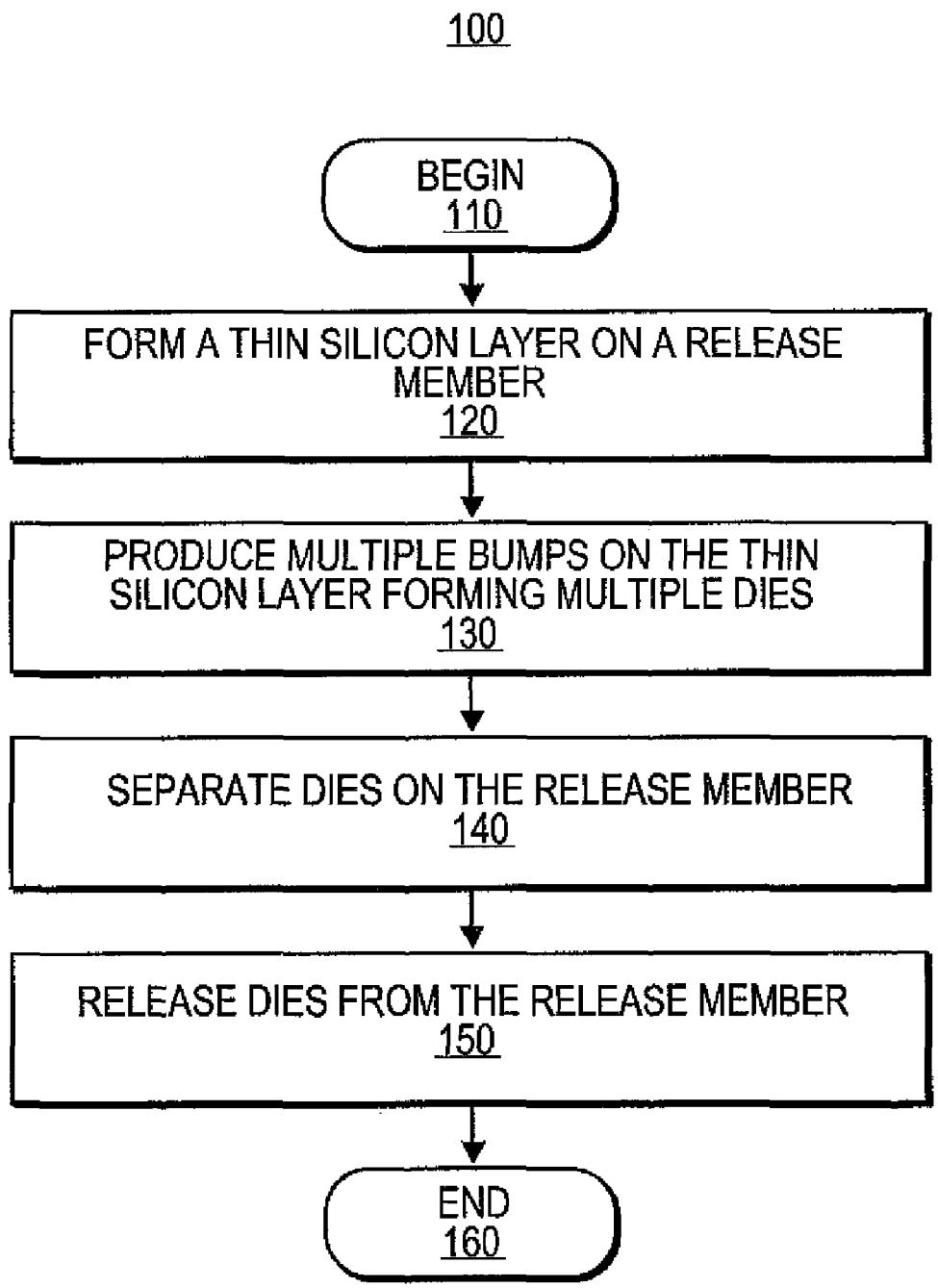
FIG. 1 depicts an exemplary method for assembling IC elements using a phase change material and a release wafer in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. $-1$, $-2$, $-3$, $-10$, $-20$, $-30$, etc.

Exemplary embodiments provide methods and systems for assembling electronic devices, such as integrated circuit (IC) chips. For example, IC elements/components can be selectively and scalably received, stored, inspected, repaired and released during the assembly of IC chips. As disclosed herein, exemplary IC elements can include, but are not limited to, display elements, detector elements, processor elements, or any other IC elements as would be understood by one of ordinary skill in the art.

For ease of illustration, the invention will be described with reference to an assembly of IC chips in an exemplary form of radio frequency identification (RFID) chips. RFID chips can be used in various applications, such as inventory control, airport baggage monitoring, as well as security and surveillance applications for location monitoring and real time tracking of such items. Generally, an RFID chip can include, e.g., a plurality of die elements (dies) mounted onto related electronics that can be located on a chip substrate. The plurality of dies can be an integrated circuit that performs RFID operations known to one of ordinary skill in the art, such as communicating with one or more chip readers according to various interrogation protocols of RFID.

As disclosed herein, the assembly of the exemplary RFID chips can include a low cost die release wafer by using a release member that has a phase-change surface. For example, in some embodiments, the die release wafer can include a combined use of one or more of the release member, a glass master wafer upon which IC dies are grown, an intermediate transfer member, and a final substrate upon which the IC dies are dropped from either the glass master wafer or the intermediate transfer member. In another embodiment, the final substrate can be in the form of a flexible, rigid, or other final substrate. In other embodiments, the die release wafer can include a combined use of the release member and the die release wafer, and a combined use of the release member and the intermediate transfer member.

As used herein and unless otherwise specified, the term "release member" refers to a layered structure that includes a phase-change material formed over a release support. The term "release member" can be used to receive dies (i.e., attach dies) and, whenever desired, to release (i.e., detach) the received dies to a subsequent surface. The "release member" can be in a form of, for example, a master glass support, an intermediate glass support, or their various combinations.

As used herein, the term "flexible" refers to the ability of a material, structure, device or device component to be deformed into a curved shape without undergoing a transformation that introduces significant strain, such as strain characterizing the failure point of a material, structure, device, or device component. The final substrate can therefore include, but is not limited to, a flexible web, flexible film, flexible plate, flexible roll, roll-to-roll, and their various combinations.

The release support of the release member can be rigid and can be formed with various shapes and sizes for the release member. The release support can be formed of a material including, but not limited to, glass, metal, silicon, or their various combinations.

The release member can include phase-change materials. As used herein, the term "phase change materials" refers to materials that can be switched between "phases", for example, between generally amorphous and generally crystalline states. These materials can absorb energies such as optical, electrical, thermal, radiative or other energy that can induce and switch the material between its different states. The "phase-change materials" can be used as a functional interface between dissimilar materials, for example, between the release member and any IC elements. Specifically, when IC elements contact a phase-change material, the phase-change material can be adhesive to allow IC elements to be held in place, and can later allow the IC elements to be released from the release member using various energy sources, for example, optical beams from sources, such as UV, or IR lasers. When releasing, the IC elements can be transferred onto a subsequent surface and the phase-change material can be removed from the release support. Such release support (e.g., glass) can often be reused, for example, by forming (e.g., depositing) a "new" layer of phase-change material thereon to form a "new" release member. Therefore, the phase-change material can provide reworkability, ease of handling, and not require a cure in a high volume setting for IC elements.

In various embodiments, the phase change material can be designed according to the type and power of the energy sources that can be used to induce the phase change. For example, one or more metal elements can be included in the phase change material, such as, for example, tin, palladium, aluminum, silicon, germanium, tellurium, antimony, indium, silver, gallium, lanthanide, and chalcogenide. The phase change material can therefore include various metals, metal alloys and/or metal compounds of a combination to trip at a predetermined temperature to conduct the phase change. Tolerances of $\pm 1\text{-}2°$ C. can be obtained. For example, metal compounds can include compounds of Ga, La, and S (GLS), as well as related compounds in which there is substitution of S with O, Se and/or Te.

By using the phase-change material, the release member can be used to receive IC elements, and to further release IC elements to any desired subsequent receiving surface (e.g., an intermediate surface or a final chip surface). Still further, the release member can be used to support the IC elements in various rigid forms. For example, the release member can be used to grow a display including, but not limited to, TV screen, radiographic detector, and/or sensor array. Such display can be used, e.g., to emit, detect and/or collect energy.

FIG. 1 depicts an exemplary method 100 for receiving and releasing IC elements using a release member and a release wafer in accordance with the present teachings. For illustrative purposes, the method 100 will be described in reference to FIGS. 2A-2B, although the method 100 is not limited to the structures shown in FIGS. 2A-2B.

The method 100 begins at 110. At 120, a thin IC (e.g. silicon) layer 120 (see FIG. 2A) can be formed on a release member 202 that includes a phase-change material 206 formed on a release support 204 such as a glass support. The thin IC layer 220 can have a thickness of, e.g., about 5 microns or less, and can be grown on the glass support as known to one of ordinary skill in the art.

At 130, a plurality of bumps 255 can be formed on the thin IC layer 220 thereby forming a plurality of dies 250. At 140, the plurality of dies 250 can be spaced apart using suitable patterning and etching processes known to one of ordinary skill in the art as shown in FIG. 2B. The device 200B can be released, for example, in a bump side down manner as similarly described in FIG. 3 and FIGS. 4A-4C. The method 100 concludes at 160 for further processes known to one of ordinary skill in the art.

Figure 2A:
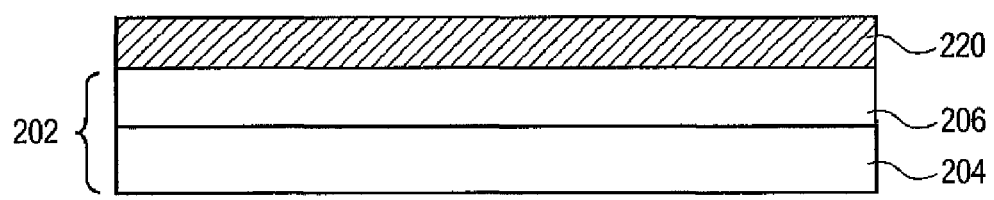
FIGS. 2A-2B depict an exemplary assembly process based on the method depicted in FIG. 1 in accordance with the present teachings.
Figure 2B:
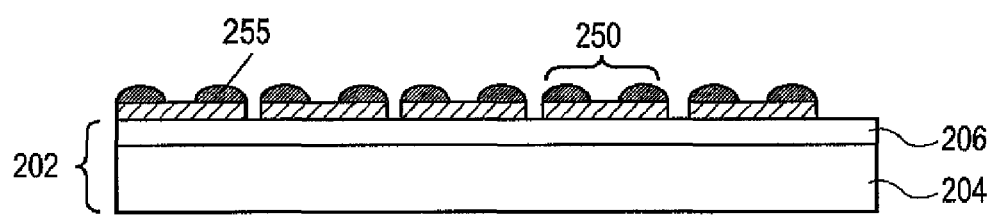
Figure 3:
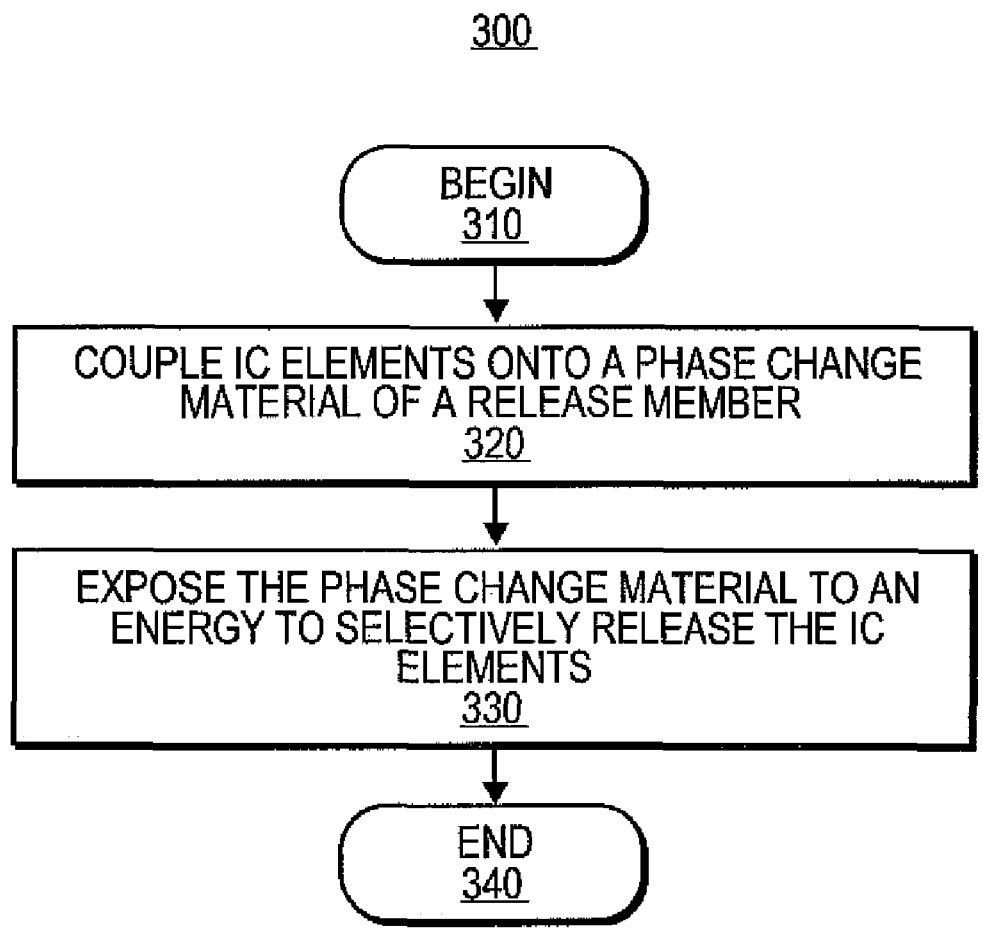
FIG. 3 depicts an exemplary method for coupling and releasing IC elements using a phase change material in accordance with the present teachings.
Figure 4A:
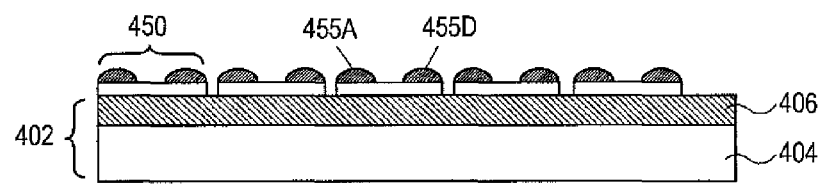
FIGS. 4A-4C depict another exemplary embodiment for assembling IC elements at various stages based on the method depicted in FIG. 1 in accordance with the present teachings.
Figure 4B:
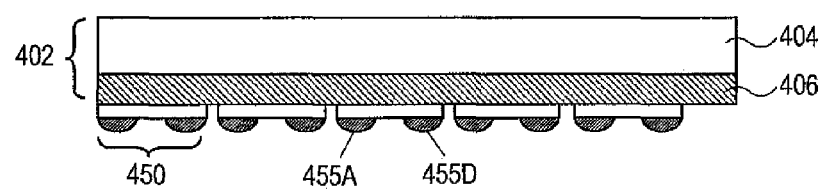
Figure 4C:
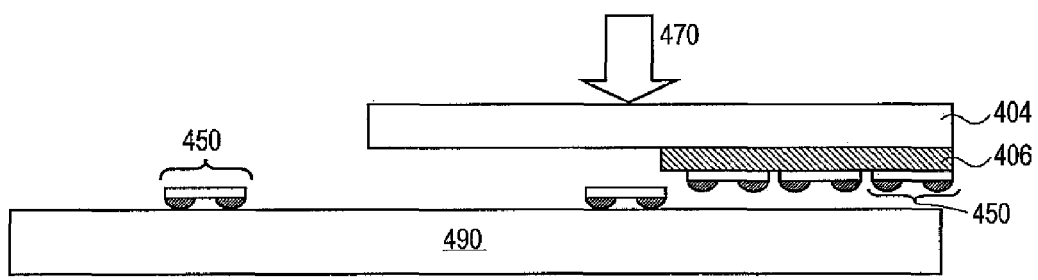

FIG. 3 and FIGS. 4A-4C depict various embodiments for transferring IC elements as formed on the die release wafer of FIGS. 1 and 2A-2B using a release member having a phase change surface in accordance with the present teachings. Specifically, FIG. 3 depicts an exemplary method 300 for coupling and releasing IC elements using the release member, while FIGS. 4A-4C depict various exemplary embodiments for assembling IC elements at various stages based on the method 300 depicted in FIG. 3. Although the method 300 will be described in reference to FIGS. 4A-4C for illustrative purposes, the process of method 300 is not limited to the structures shown in FIGS. 4A-4C.

The method 300 begins at 310 in FIG. 3. At 320, IC elements can be coupled with a release member through a phase change material formed on a release support. For example, a plurality of RFID dies can be coupled with the release member at the surface of the phase change material. In various embodiments, the phase change material can be patterned on the release support of the release member. Each patterned phase change material can be selectively used to couple one of the plurality of RFID dies.

Each exemplary RFID die can further include a plurality of contacts to provide an electrical connection of the RFID die with the related electronics for the RFID chips. The plurality of contacts can include, for example, conductive traces, such as conductive ink traces, or conductive bumps or bumps attached to a strap. In various embodiments, the exemplary conductive bumps can be formed on a die support, such as glass or silicon. The conductive bumps can further be built up, if required by the assembly process, by the deposition of additional materials, such as gold and solder flux. Such "bumping" processes are known to one of ordinary skill in the relevant arts.

The plurality of dies (e.g., wherein each die includes a plurality bumps) can therefore be mounted in a "bump side down" orientation. As used herein the term "bump side down" denotes an implementation of the plurality of dies. In particular, the term designates the orientation of connection bumps in relation to a subsequent surface, such as a chip substrate. That is, in a "bump side down" orientation, the plurality of dies can be transferred to the subsequent surface with bumps facing towards, and in contact with the subsequent surface.

In various embodiments, the subsequent surface can be an intermediate transfer surface, or an actual final chip substrate to which the dies can be permanently attached. If the subsequent surface is not a final surface, the plurality of dies can be transferred to an intermediate surface, such as the surface of an intermediate transfer member as disclosed herein. In various embodiments, the subsequent surface can be rigid or flexible, including a roll-to-roll surface, and can be formed from various materials chosen from, for example, glass, plastic, silicon wafer, etc., for either the intermediate surface or final chip substrate.

For example, as shown in FIG. 4A, device 400A can allow for a "bump side down" release. As shown, the device 400A can include a plurality of dies 450 formed on a release member 402, wherein each die 450 can include a plurality of bumps 455a-d, and the release member 402 can include a phase-change material 406 formed on a release support 404.

Note that the plurality of bumps 455a-d in device 400A are shown in a cross section view, wherein contact bumps 455a-d can be arranged in a rectangular shape that allows for flexibility in die placement, and good mechanical adherence between surfaces. In various embodiments, any number of contact bumps can be formed for devices 400A, depending on a particular application. In addition, contact bumps 455a-d can be laid out in other shapes in accordance with the present teachings.

Referring again to FIG. 3, at 330, the release member that is coupled with IC elements can be exposed to an energy source to induce a phase change of the phase-change material, and thus to release the IC elements from the release member leaving the release support to be, for example, reused. And the method 300 concludes at 340.

In the exemplary embodiment of the method 300, as shown in FIG. 4A, in order to release the plurality of dies 450 in FIG. 4A, the device 400A can be flipped upside down to have the bumps 455 face "down" with respect to the die 450 as shown in FIG. 4B. The device 400B can then be placed close to and/or in contact with a subsequent surface 490.

The device 400B (see FIG. 4B) can then be exposed to an energy to induce a phase change of the phase-change material (e.g., 406) of the release member (e.g., 402). Because of the induced phase change, the plurality of dies can be released from the release member (402) (e.g., onto a prepared subsequent surface 490) In various embodiments, the energy source can be, for example, an optical source such as a laser beam of UV or IR. In the case when an optical energy is used, the release member (e.g., 402), including the release support (e.g., 404) can be at least partially transparent in order to transmit the optical signal onto the phase change material (e.g., 406).

Specifically, in FIG. 4C, the device 400C can be exposed to, e.g., an IR laser beam 470. When the IR laser beam 470 hits the phase-change material 406 of the release member 402, the phase-change material 406 can absorb this laser energy by design and induce a phase change between its different states to release each of the plurality of dies 450 from the device 400B (i.e., from the release support 404) to the subsequent surface 490.

The subsequent surface 490 can include an adhesive substance (not shown) formed on a subsequent substrate. The adhesive substance can be known to one of ordinary skill in the art sufficient to hold the attached elements in place on the subsequent surface and can also be easily transported carrying the attached elements. The subsequent surface 490 can include a metal coating (not shown) such that a bump passing through the metal coating can contact the substrate. The subsequent substrate can be an intermediate substrate and/or a final chip substrate.

In various embodiments, prior to releasing, the subsequent surface 490 can be placed in contact with the die elements and be pressed against the die elements that reside on the release member (e.g., 402) causing the elements to attach to the adhesively coated subsequent surface. Likewise, the subsequent surface 490 can be placed in contact with the die elements and be pressed against the die elements that reside on the release member (e.g. 402 in FIG. 4B), and with an application of heat or energy, cause the elements to attach to the metal coated subsequent surface, with contact through to the substrate. When exposed to releasing energy, the phase change material (e.g., 406) can conduct a phase change to release the die elements and can be removed, leaving the dies 450 attached on the subsequent surface.

It is noted that the method 300 and the processes 400 can be implemented on any portion of, or all of the dies on the release member. For example, the method and processes can be accomplished in one or more iterations, using one or more strips of an adhesive or metal coated on the subsequent substrate that each adhere to and carry away a group of dies from the release member. Alternatively, a sheet sized adhesive or metal coated subsequent surface can be used to adhere to and carry away multiple groups or any size array of the dies from the release member.

In this manner, as described in FIGS. 3-4, the disclosed release member can provide a "controllable" technique for selectively receiving, storing, screening (inspecting), repairing, and/or releasing IC elements. First, the release member can provide a scalable high volume assembly of IC elements. For example, when glass is used for the release member, a glass release member can be formed having dimensions on an order of meters (e.g., about 2×2 square meters), while a traditional silicon wafer generally has a maximum diameter of, for example, about 8 inches. In the event of a flexible release member, a large releasing area can be provided, for example, any part of a substrate and as much as an entire web. Accordingly, a large area for transferring and receiving can be selectively performed. Second, the release member can have various shapes and provide conformability for storing or further usage. Third, by using the release member, the assembly process of IC elements can be controlled. That is, a selective inspection and/or a selective repair can be performed prior to releasing of the IC elements from the release member. For example, a group of the IC elements on the phase change material can be selectively inspected using a test circuit based on specific applications. An inspected IC element that needs to be repaired can then be determined and selectively released from the release member by applying energy to a selected portion of the phase change material, to which the determined IC element is coupled. Fourth, when releasing, by using the phase change material, one or more selected IC elements or multiple IC elements can be released at a time. In addition, the disclosed releasing process of the IC elements can be performed continuously for all of the IC elements at a time or selectively for a portion of the IC elements at a time. Finally, the geometry and distribution of the released IC elements can be selectively changed when transferring to the subsequent surface after releasing.

In various embodiments, the method 300 can be used to transfer IC elements between any two surfaces during the IC processes by using the phase change material on various surfaces. The transfer between any two surfaces can include, for example, transferring IC elements from a release member to an intermediate surface, transferring IC elements between multiple intermediate surfaces, transferring IC elements between an intermediate surface and the final substrate surface, and transferring IC elements from the release member to the final substrate surface.

In addition, the method 300 can be applicable and employed for a desired bump side down release according to a particular application. In various embodiments, the release member of the method 300 can be used in combination with an intermediate transfer member, and/or a release wafer for a desired release.

In various embodiments, the method and process in FIG. 3 and FIGS. 4A-4B can be repeated as desired to receive, release and transfer IC elements. For example, the plurality of dies can be transferred to any two surfaces for either a bump side up or a bump side down orientation by using one or more intermediate transfer members and at least one release member.

In various embodiments, the resulting placement of die 450 as depicted in FIG. 4C can be further processed by individually or uniformly encapsulating the released die. An exemplary description is as follows in connection with FIGS. 5 and 6A-6D. It will be appreciated that encapsulation, however, can be employed for each of the exemplary embodiments herein and the following description is not intended to be limited to the embodiment shown.

Figure 5:
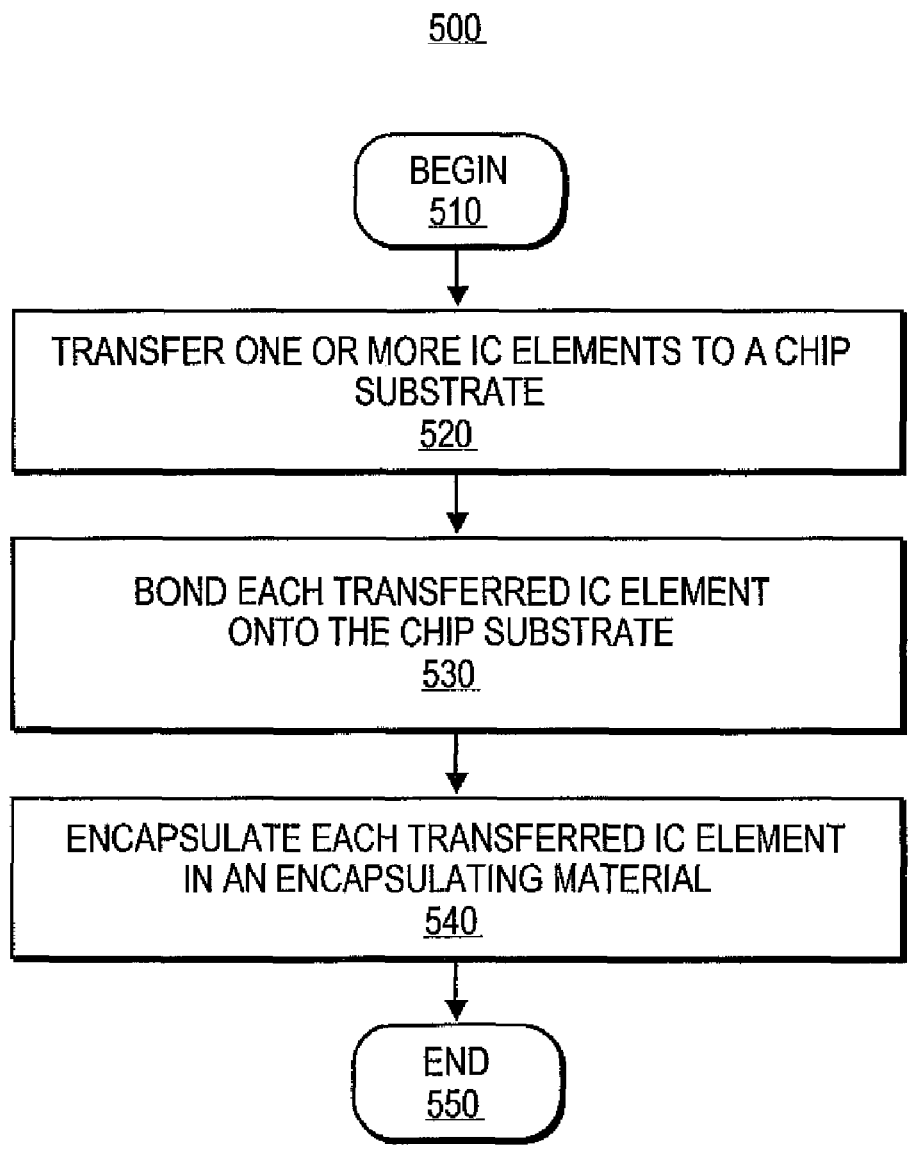
FIG. 5 depicts an exemplary method for a "bump side down" assembly of IC elements onto a chip substrate and including encapsulation in accordance with the present teachings.

FIG. 5 depicts an exemplary method for a "bump side down" assembly of IC elements onto a chip substrate with subsequent encapsulation in accordance with the present teachings.

FIGS. 6A-6D depict an exemplary process at various stages according to the method depicted in FIG. 5 in accordance with the present teachings.

As disclosed herein, the assembly of IC elements (e.g., the dies for RFID chips) can include releasing the IC elements from a release layer, transferring them onto a receiving surface (e.g., a chip substrate surface) and accommodating (e.g., encapsulating) them with the receiving surface.

Specifically, FIG. 5 depicts an exemplary method 500 for assembling IC chips onto a chip substrate using an encapsulating material for a "bump side down" assembly, while FIGS. 6A-6D depict an exemplary process at various stages of the method 500 depicted in FIG. 5 in accordance with the present teachings. Although the method 500 will be described with reference to FIGS. 6A-6D for illustrative purposes, the process of method 500 is not limited to the structures shown in FIGS. 6A-6D.

The method 500 begins at 510 in FIG. 5. At 520, the IC elements can be released from a release layer and then be transferred onto a chip substrate. In various embodiments, prior to the transferring, the chip substrate can be prepared for a "bump side down" assembly of the IC elements. The chip substrate can be prepared by, for example, printing the supporting electronics thereon. The printed supporting electronics can be determined based on particular applications, for example, antennas can be printed on the chip substrate for an RFID device.

Figure 6A:
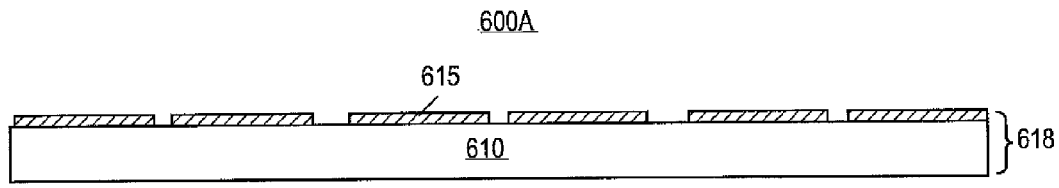
FIGS. 6A-6D depict an exemplary process at various stages of encapsulation according to the method depicted in FIG. 5 in accordance with the present teachings.
Figure 6B:
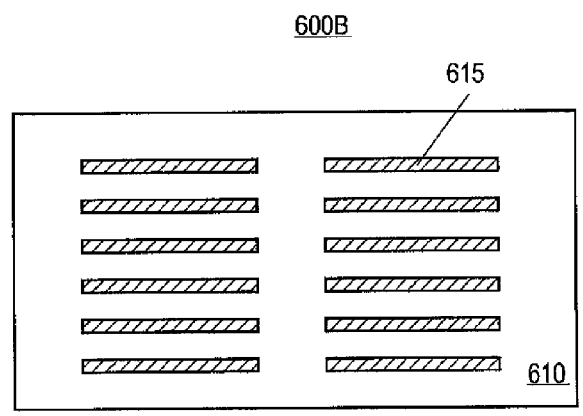

For example, FIGS. 6A-6D illustrate an exemplary prepared chip substrate 600A/B. As shown in the cross sectional view of FIG. 6A, an exemplary antenna substrate 618 (see 600A) can include a plastic chip substrate 610 and a plurality of antennas 615 formed thereon. FIG. 6B shows a top view of the exemplary antenna substrate 618 (see 600B). The plurality of antennas 615 can include various conductive materials such as metal, metal alloy or other known suitable material. The plurality of antennas 615 can be formed by, for example, sintering screen printed silver paste and/or sintering grauvere printed silver nanoparticles.

Figure 6C:
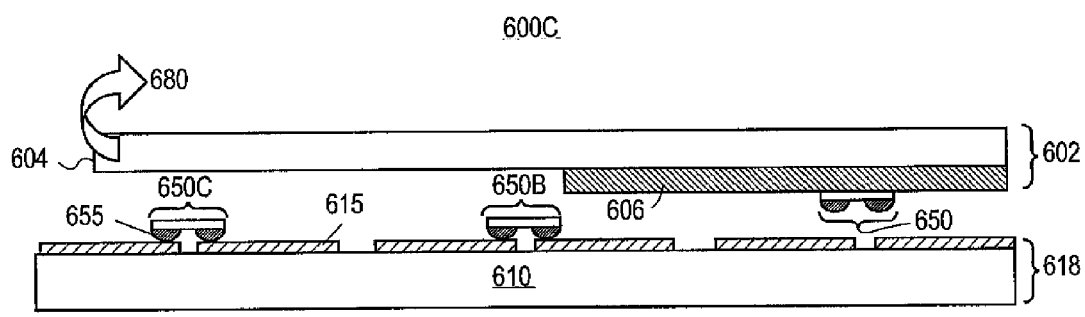

The device 600C in FIG. 6C indicates that one or more IC elements 650 can be released from a release layer 602 and transferred onto the exemplary antenna substrate 618 (see 600A and/or 600B). The release layer 602 can further include a release substrate 604 having a functional surface 606 formed thereon. In one embodiment, the functional surface 606 can include a tape-adhesive surface for holding the one or more IC elements 650, followed by an easy release (e.g., detaching) from the release substrate 604. In another embodiment, the functional surface 606 can be a phase change material formed on the release substrate 604. The one or more elements 650 can therefore be attached to and later be released from the release layer 602 through the phase change induced by, for example, an optical energy such as a UV or IR laser (not shown). In this case, the release substrate 604 can be a laser transmissive release substrate so that an optical signal can be applied onto the phase change material 606 through the release substrate 604. The one or more IC die elements 650 can thus be detached from the release substrate 604 due to the phase change.

The released (i.e., detached) one or more dies 650, e.g., 650B and 650C shown in FIG. 6C, can then be transferred onto the antenna substrate 618 having an electrically conductive contact with the plurality of antennas 615 through a plurality of bump bonds 655 of each transferred die 650B or 650C. In various embodiments, a conductive adhesive or an activatable thermal barrier layer can be disposed between the antenna 615 of the chip substrate 610 and the bump bonds 655 of each die 650B or 650C.

At 530 in FIG. 5, the transferred IC elements can further be bonded with the exemplary antenna substrate by, for example, applying a pressure, a heat and/or a combination thereof.

Figure 6D:
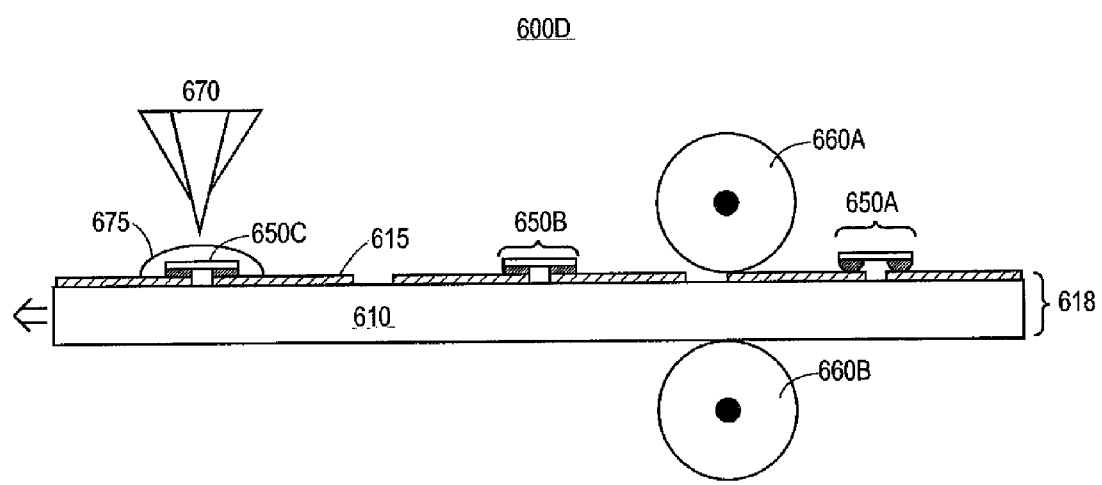

For example, as shown in FIG. 6D, the transferred dies can be bonded with the antenna substrate 618 by using various application rollers 660A/B to form bonded dies (e.g., 650B or 650C) on the antenna substrate 618.

In one embodiment, at least one pressure roller such as 660A can be used to apply pressure to each transferred die 650 to provide a compressive pressure for bonding the bump bonds 655 of the die 650 with the underlying antenna substrate 618. In various embodiments, more pressure rollers can be used. For example, a second pressure roller, feed, or idler roller 660B can oppose the roller 660A and be positioned on an opposite side of the chip substrate 610 to assist in bonding each die (e.g., 650 B/C) with the antenna substrate 618.

In another embodiment, at least one heating roller 660A can be used to roll over each transferred die 650 to provide a thermal energy for bonding each transferred die with the underlying antenna substrate 618. In various embodiments, more heating rollers can be used. For example, a second heating roller, feed, or idler roller 660B can oppose the roller 660A and be positioned on an opposite side of the chip substrate 610 to assist in bonding each die (e.g., 650 B/C) with the antenna substrate 618.

In an additional embodiment, each transferred die 650 can be bonded with the underlying antenna substrate 618 by applying both a compressive pressure and thermal energy using one or more of an exemplary roller 660A and an exemplary roller 660B. In addition, the compressive pressure and the heat can be applied by, for example, one or more pressure rollers and one or more heating rollers. In the event of multiple rollers formed in series, pressure and heat can then be applied either sequentially or simultaneously according to a positioning of rollers.

At 540 in FIG. 5, the bonded IC elements on the antenna substrate can be encapsulated in place using an encapsulating material, which can be a curable material including, but not limited to, polyurethane, polyethylene, polypropylene, polystyrene, polyester, and epoxy, and combinations thereof. The encapsulating material can be generally deposited over electronic components (e.g., dies 650B or 650C in FIG. 6D) mounted on a chip substrate (e.g., the antenna substrate 618) using, for example, a syringe-type dispenser moved over the chip substrate. For example, dams (e.g., 675 in FIG. 6D) of high viscosity encapsulating material 670 can be first deposited around areas where components are bonded and then the areas within the dams can be cured by, for example, applying pressure, heat or radiation depending on the chosen encapsulating material. As still shown in FIG. 6D, the exemplary bonded die 650C can be locked in place on the antenna substrate 618 within the cured encapsulating material 675.

In various embodiments, the acts of releasing, transferring, bonding, and encapsulating of the one or more IC elements illustrated in the method 500 can be performed simultaneously in a successive manner using, for example, a flexible sheet to sheet process or flexible roll to roll process. Upon releasing the die 650 in FIG. 6C, the release support 604 can be removed at 680 from over the antenna substrate 618 to expose the released and transferred dies 650C and 650B, which can then be subjected to the application roller 660A or 660B rolling over the transferred dies 650C and 650B (see FIG. 6D) for a bonding, followed by depositing the encapsulating material 670 to cover the bonded die (e.g., 650C in FIG. 6D). In this manner, a large amount of dies can be released, transferred, bonded and encapsulated selectively, successively, and simultaneously.

Note that the exemplary dies 650A, 650B, and 650C shown in FIG. 6D illustrate die status at various stages of the assembly of IC elements based on the method 500 of FIG. 5. For example, the die 650A illustrates an exemplary transferred die at 520 of the method 500; the die 650B illustrates an exemplary bonded die at 530 of the method 500; and the die 650C illustrates an exemplary encapsulated die at 540 of the method 500. The method 500 can conclude at 540 having the one or more encapsulated IC die elements on the chip substrate.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A method for assembling integrated circuits comprising:
  forming a integrated circuit (IC) layer on a phase change material of a release member;
  forming a plurality of bump bonds on the IC layer of the release member;
  forming one or more spaced dies on the phase change material by etching through the IC layer, wherein each spaced die comprises one or more bump bonds formed on an etched IC layer;
  exposing the phase change material to an energy to induce a phase change for selectively releasing the one or more spaced dies from the release member; and
  wherein the release member comprises a glass having a surface of about 2 square meters or more.

2. The method of claim 1, further comprising placing the one or more released IC elements onto a subsequent surface, wherein the subsequent surface is flexible or rigid.

3. The method of claim 2, wherein the subsequent surface comprises plastic, glass, metal, or packaging material.

4. The method of claim 2, wherein the subsequent surface comprises a roll-to-roll material.

5. The method of claim 2, further comprising:
bonding each transferred IC element onto the chip substrate, wherein bonding each transferred IC element comprises one or more processes of applying pressure and heat to bond each transferred IC element onto the chip substrate; and
encapsulating each bonded IC element in an encapsulating material.

6. The method of claim 5, wherein the bonding comprises using at least one pressure roller and at least one heat roller to bond the transferred IC elements onto the chip substrate.

7. The method of claim 5, wherein encapsulating each bonded IC element comprises applying a translucent encapsulating material or an opaque encapsulating material, and curing the encapsulating material.

8. The method of claim 1, wherein the energy that induces phase change is produced by one of more of an optical energy, a magnetic energy, a thermal energy, a radiative energy, or an electrical energy.

9. A method for assembling integrated circuits comprising:
forming a integrated circuit (IC) layer on a phase change material of a release member;
forming a plurality of bump bonds on the IC layer of the release member;
forming one or more spaced dies on the phase change material by etching through the IC layer, wherein each spaced die comprises one or more bump bonds formed on an etched IC layer;
exposing the phase change material to an energy to induce a phase change for selectively releasing the one or more spaced dies from the release member; and
wherein the phase change material comprises one or more metals, metal alloys and/or metal compounds of a combination to trip at a predetermined temperature to conduct the phase change.

10. The method of claim 9, wherein the release member further comprises a release support having the phase change material formed thereon.

11. The method of claim 10, wherein the release member has a surface area of at least about any part of a substrate and as much as an entire web.

12. The method of claim 10, wherein the release member is at least partially transparent.

13. A method for assembling integrated circuits comprising:
forming a integrated circuit (IC) layer on a phase change material of a release member;
forming a plurality of bump bonds on the IC layer of the release member;
forming one or more spaced dies on the phase change material by etching through the IC layer, wherein each spaced die comprises one or more bump bonds formed on an etched IC layer;
exposing the phase change material to an energy to induce a phase change for selectively releasing the one or more spaced dies from the release member; and
wherein the energy is generated by a UV laser or an IR laser.

14. A method for controlling an assembly of IC elements comprising:
coupling one or more IC elements onto a phase change material of a release member;
selectively inspecting a group of the one or more IC elements on the phase change material; and
selectively applying an energy to a portion of the phase change material to release an inspected IC element for repair.

* * * * *